United States Patent [19]

Gates, Jr.

[11] Patent Number: 5,600,183

[45] Date of Patent: Feb. 4, 1997

[54] MULTI-LAYER FILM ADHESIVE FOR ELECTRICALLY ISOLATING AND GROUNDING AN INTEGRATED CIRCUIT CHIP TO A PRINTED CIRCUIT SUBSTRATE

[75] Inventor: Louis E. Gates, Jr., Westlake Village, Calif.

[73] Assignee: Hughes Electronics, Los Angeles, Calif.

[21] Appl. No.: 340,137

[22] Filed: Nov. 15, 1994

[51] Int. Cl.$^6$ .......................... H01L 23/02; H01L 23/52; H01L 23/48

[52] U.S. Cl. .......................... 257/783; 257/753; 257/777; 257/779; 257/691

[58] Field of Search ................................ 257/783, 753, 257/789, 774, 777–779, 691, 686; 361/780, 783

[56] References Cited

U.S. PATENT DOCUMENTS

| | | | |
|---|---|---|---|
| 5,175,397 | 12/1992 | Lindberg | 257/676 |
| 5,262,674 | 11/1993 | Banerji et al. | 257/783 |
| 5,311,057 | 5/1994 | McShane | 257/691 |
| 5,313,365 | 5/1994 | Pennisi et al. | 257/788 |
| 5,371,404 | 12/1994 | Juskey et al. | 257/778 |
| 5,381,047 | 1/1995 | Kanno | 257/783 |

FOREIGN PATENT DOCUMENTS

| | | | |
|---|---|---|---|
| 0031166 | 2/1982 | Japan | 257/777 |
| 0028856 | 1/1989 | Japan | 257/686 |
| 1084894 | 9/1967 | United Kingdom | 257/691 |

*Primary Examiner*—Sara W. Crane
*Assistant Examiner*—Alexander Oscar Williams
*Attorney, Agent, or Firm*—Leonard A. Alkov; Wanda K. Denson-Low

[57] ABSTRACT

An integrated circuit chip bonding system comprising a multi-layer film adhesive for mounting an integrated circuit chip to a printed circuit substrate having a metallized grounding pad disposed thereon that is connected to a circuit ground of the integrated circuit chip. The multi-layer film adhesive comprises a lower film layer that is a dielectric insulator, and an upper film layer that is disposed in contact with the chip. The length and width dimensions of the upper film layer are slightly larger than the dimensions of the integrated circuit chip, and the dimensions of the lower film layer are slightly larger than the dimensions of the upper film layer. Conductive adhesive is used to electrically connect the upper film layer to the circuit ground by way of the metallized pad.

19 Claims, 1 Drawing Sheet

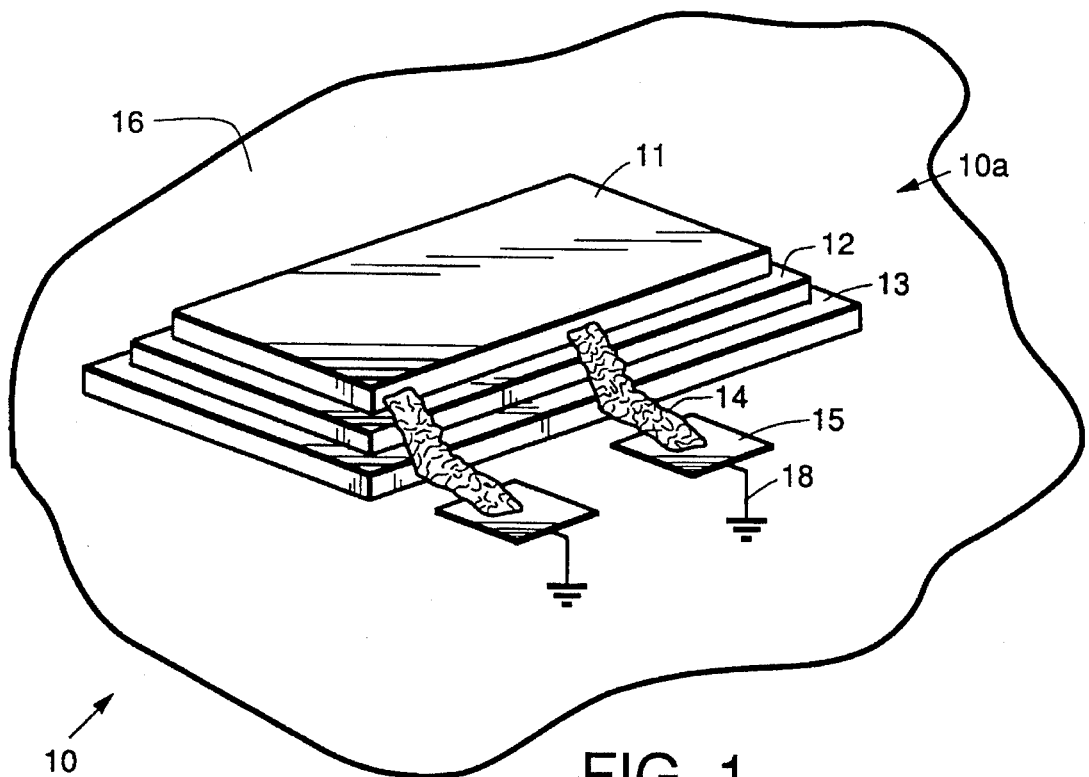
FIG. 1.
FIG. 2.
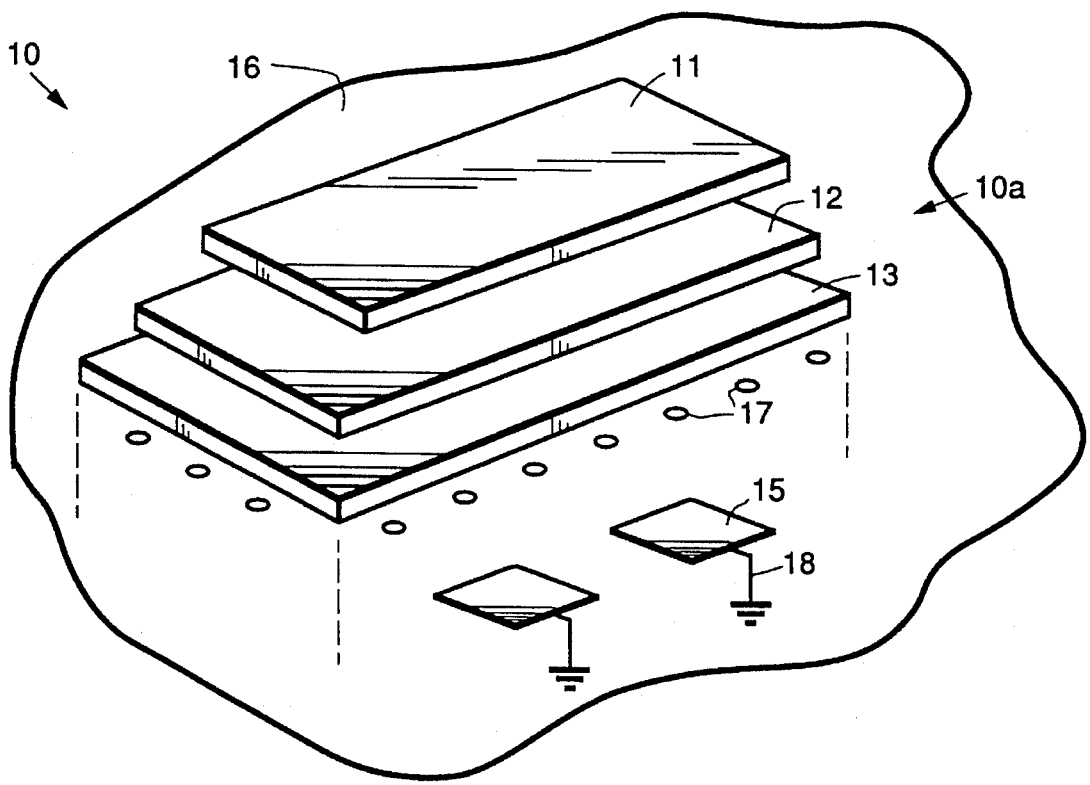

MULTI-LAYER FILM ADHESIVE FOR ELECTRICALLY ISOLATING AND GROUNDING AN INTEGRATED CIRCUIT CHIP TO A PRINTED CIRCUIT SUBSTRATE

BACKGROUND

The present invention relates generally to integrated circuits, and more particularly, to a multi-layer film adhesive for electrically isolating and grounding an integrated circuit chip to a printed circuit substrate.

Integrated circuit chips are conventionally mounted on a printed circuit substrate with either conductive or nonconductive adhesive. Such adhesives typically contain fillers to enhance thermal conduction of heat from the chip to the substrate and to electrically ground the chip to a metallized die attachment pad on the substrate. A metal filler such as silver powder serves this purpose well. If the chip must be electrically isolated from the substrate, a dielectric filled adhesive is used and the substrate does not have a metallized pad beneath the chip.

However, conventional mounting arrangements for integrated circuit chips that must be electrically grounded do not provide for very high density circuits. Furthermore, in such conventional circuits, a severe area penalty is suffered in requiring all routing vias to be placed outside the chip mounting area.

Therefore, it is an objective of the present invention to provide for an integrated circuit chip bonding system comprising a multi-layer film adhesive for electrically isolating and grounding an integrated circuit chip to a printed circuit substrate.

SUMMARY OF THE INVENTION

In order to meet the above and other objectives, the present invention comprises an integrated circuit chip bonding system comprising a multi-layer film adhesive for mounting an integrated circuit chip to a printed circuit substrate. The multi-layer film adhesive comprises a lower film layer that is a dielectric insulator, and an upper film layer that is disposed in contact with the chip. The upper film layer is electrically conductive. The length and width dimensions of the upper film layer of the film are slightly larger than the dimensions of the integrated circuit chip, and the dimensions of the lower film layer are slightly larger than the dimensions of the upper film layer. On the substrate, disposed adjacent to the lower film layer, is a metallized pad connected to a circuit ground of the integrated circuit. Conductive adhesive is used to electrically connect the upper film layer to the circuit ground by way of the metallized pad.

The present invention permits use of electrical interconnection vias disposed beneath the integrated circuit chip, and electrically isolates the chip from these vias, while providing a means to connect the underside of the the integrated circuit chip to the circuit ground. An advantage of the present invention is that high integrated circuit chip density is achieved due to closer chip spacing by utilizing the area beneath the chip for the vias.

The present invention promotes and permits usage of integrated circuit chips that must be electrically grounded in very high density circuits. Without the present invention, a severe area penalty is suffered because all routing vias must be placed outside the chip mounting area.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which:

FIG. 1 shows a perspective view of a multi-layer film adhesive for electrically isolating and grounding an integrated circuit chip to a printed circuit substrate in accordance with the principles of the present invention; and FIG. 2 shows an exploded view of the multi-layer film adhesive and integrated circuit chip of FIG. 1 showing vias disposed beneath the chip.

DETAILED DESCRIPTION

Referring to the drawing figures, FIG. 1 shows a perspective view of an integrated circuit chip bonding system 10 comprising a multi-layer film adhesive 10a for electrically isolating and grounding a base of an integrated circuit chip 11 to a printed circuit substrate 16 in accordance with the principles of the present invention. FIG. 2 shows an exploded view of the multi-layer film adhesive 10a and integrated circuit chip 11 of FIG. 1 showing vias 17 disposed beneath the chip 11.

As is shown in FIG. 1, the multi-layer film adhesive 10a comprises upper and lower film layers 12, 13. The upper and lower film layers 12, 13 are used to mount and secure the integrated circuit chip 11 to the printed circuit substrate 16.

The lower film layer 13 is a dielectric insulator that may be comprised of an organic resin such as epoxy, containing a thermally conductive dielectric filler such as aluminum oxide or aluminum nitride powder, for example, and is dimensionally larger than the upper film layer 12. The upper film layer 12 is larger than the integrated circuit chip 11. The upper film layer 12 is also electrically conductive, and may be comprised of an organic resin such as epoxy, containing a thermally and electrically conductive metal filler such as silver powder, for example. The upper film layer 12 is electrically connected to a ground pad 15 disposed on the substrate 16 using conductive adhesive 14. The conductive adhesive 14 may be comprised of an organic resin such as epoxy, containing a thermally and electrically conductive metal filler such as silver powder, for example. The lower film layer 13 electrically isolates the upper conductive film layer 12 from electrical interconnection circuit routing vias 17 disposed beneath the integrated circuit chip 11, as is shown in FIG. 2.

The metallized grounding pad 15 is disposed on the substrate 16 adjacent to the lower film layer 13 and is connected to a circuit ground 18 of a printed circuit; and conductive adhesive 14 is used to electrically connect the upper film layer 12 and the base of the interpated circuit chip 11 to the and the base of the integrated circuit chip 11 circuit ground 18 by way of the metallized pad 15.

Thus there has been described a new and improved integrated circuit chip bonding system comprising a multi-layer film adhesive for electrically isolating and grounding an integrated circuit chip to a printed circuit substrate. It is to be understood that the above-described embodiment is merely illustrative of some of the many specific embodiments that represent applications of the principles of the present invention. Clearly, numerous and other arrangements can be readily devised by those skilled in the art without departing from the scope of the invention.

What is claimed is:

1. An integrated circuit chip bonding system for electrically isolating and grounding a base of an integrated circuit chip to a printed circuit substrate having electrical interconnection circuit routing vias disposed beneath the integrated circuit chip, said bonding system comprising:

a multi-layer film adhesive comprising:

an electrically conductive upper film layer having dimension that are larger than the integrated circuit chip and that electrically contacts the base of the integrated circuit chip; and a dielectric insulating lower film layer having dimensions that are larger that the upper film layer that overlies electrical interconnection circuit routing vias disposed beneath the integrated circuit chip; conductive adhesive disposed on a portion of exterior surfaces and edges of the electrically conductive upper film layer and the dielectric insulating lower film layer that interconnects the electrically conductive upper film layer and a ground pad disposed on the substrate.

2. The bonding system of claim 1 wherein the electrically conductive upper film layer comprises an organic resin containing a thermally and electrically conductive metal filler.

3. The bonding system of claim 2 wherein the organic resin comprises epoxy.

4. The bonding system of claim 3 wherein the thermally and electrically conductive metal filler comprises silver powder.

5. The bonding system of claim 1 wherein the dielectric insulating lower film layer comprises an organic resin containing a thermally conductive dielectric filler.

6. The bonding system of claim 5 wherein the organic resin comprises epoxy.

7. The bonding system of claim 6 wherein the thermally conductive filler comprises aluminun oxide.

8. The bonding system of claim 6 wherein the thermally conductive filler comprises aluminun nitride.

9. The bonding system of claim 1 wherein the electrically conductive adhesive comprises an organic resin containing a thermally and electrically conductive metal filler.

10. The bonding system of claim 9 wherein the organic resin comprises epoxy.

11. The bonding system of claim 10 wherein the thermally and electrically conductive metal filler comprises silver powder.

12. An integrated circuit chip bonding system comprising:

a printed circuit substrate having electrical interconnection circuit routing vias and a ground pad disposed thereon;

an integrated circuit chip disposed on the substrate such that the electrical interconnection circuit routing vias are disposed beneath the integrated circuit chip;

a multi-layer film adhesive comprising an electrically conductive upper film layer having dimensions that are larger than the integrated circuit chip disposed adjacent to and in electrical contact with the metallized base of an integrated circuit chip, and a dielectric insulating lower film layer having dimensions that are larger than the upper film layer disposed between the integrated circuit chip and the substrate; and conductive adhesive disposed on a portion of exterior surfaces and edges of the electrically conductive upper film layer and the dielectric insulating lower film layer that electrically interconnects the electrically conductive upper film layer and the ground pad disposed on the substrate.

13. The bonding system of claim 12 wherein the electrically conductive upper film layer comprises an organic resin containing a thermally and electrically conductive metal filler.

14. The bonding system of claim 13 wherein the organic resin comprises epoxy and the thermally and electrically conductive metal filler comprises silver powder.

15. The bonding system of claim 12 wherein the dielectric insulating lower film layer comprises an organic resin containing a thermally conductive dielectric filler.

16. The bonding system of claim 15 wherein the organic resin comprises epoxy and the thermally conductive metal filler comprises aluminum oxide.

17. The bonding system of claim 15 wherein the organic resin comprises epoxy and the thermally conductive metal filler comprises aluminum nitride.

18. The bonding system of claim 13 wherein the conductive adhesive comprises an organic resin containing a thermally and electrically conductive metal filler.

19. The bonding system of claim 18 wherein the organic resin comprises epoxy and the thermally and electrically conductive metal filler comprises silver power.

* * * * *